United States Patent [19]
Brenner et al.

[11] Patent Number: 6,063,696
[45] Date of Patent: *May 16, 2000

[54] METHOD OF REDUCING WAFER PARTICLES AFTER PARTIAL SAW USING A SUPERHARD PROTECTIVE COATING

[75] Inventors: Mike Brenner, Dallas; Timothy J. Hogan, Allen; Lawrence D. Dyer; Lisa A. T. Lester, both of Richardson; Joseph G. Harden, Garland, all of Tex.

[73] Assignee: Texas Instruments Incorporated, Dallas, Tex.

[ * ] Notice: This patent is subject to a terminal disclaimer.

[21] Appl. No.: 09/072,399

[22] Filed: May 4, 1998

Related U.S. Application Data

[60] Provisional application No. 60/045,895, May 7, 1997.

[51] Int. Cl.⁷ ........................................ H01L 21/46

[52] U.S. Cl. .................................................. 438/465

[58] Field of Search ...................... 438/460–465

[56] References Cited

U.S. PATENT DOCUMENTS

| | | | |
|---|---|---|---|
| 4,033,027 | 7/1977 | Fair et al. | 438/465 |
| 5,817,569 | 10/1998 | Brenner et al. | 438/460 |

*Primary Examiner*—Olik Chaudhuri
*Assistant Examiner*—Anh Duy Mai
*Attorney, Agent, or Firm*—Charles A. Brill; Frederick J. Telecky, Jr.; Richard L. Donaldson

[57] ABSTRACT

A method of fabricating a monolithic device, preferably a micromechanical device, from a wafer (20) by carefully selecting the composition of two or more layers of photoresist (52,54). The present invention uses a superhard protective layer such as DLC or TiW deposited over the partially fabricated device prior to a partial-saw. This superhard protective layer reduces the generation of defects in the underlying photoresist layers, and allows a wet chemical HF acid to etch away particles and damage of the underlying oxide edges. A 6% BHF solution can be utilized. The present invention substantially improves the yield of micromechanical devices.

15 Claims, 5 Drawing Sheets

FIG. 2
(CONVENTIONAL)
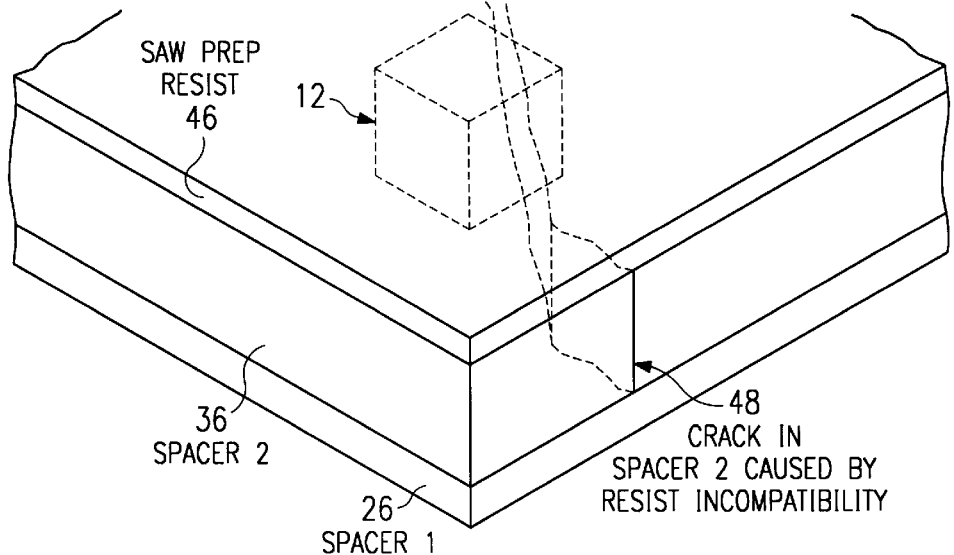

METHOD OF REDUCING WAFER PARTICLES AFTER PARTIAL SAW USING A SUPERHARD PROTECTIVE COATING

This application claims priority under 35 U.S.C. § 119 (e) (1) of provisional application Ser. No. 60/045,895 filed May 7, 1997.

CROSS REFERENCE TO RELATED APPLICATIONS

Cross reference is made to the following co-pending patent applications, each being assigned to the same assignee as the present invention and the teachings included herein by reference:

| SER. NO. | TITLE | FILING DATE |
| --- | --- | --- |
| 08/369,838 | Separation of Wafer Into Die with Wafer-Level Processing | 01/06/95 |
| 08/424,021 | Active Yoke Hidden Hinge Digital Micromirror Device | 04/18/95 |
| 60/016,732 | Method of Reducing Wafer Particles After Partial Saw | 05/02/96 |
| 60/015,107 | Method of Cleaning Wafer After Partial Saw | 04/10/96 |

FIELD OF THE INVENTION

This invention relates generally to a method of manufacturing semiconductor dies from wafers, such as those used for integrated circuits, and more particularly to a method of fabricating a wafer and then cleaning the wafer after a partial-saw process, before subsequent processing procedures.

BACKGROUND OF THE INVENTION

Conventional manufacturing techniques mass produce integrated circuit dies from wafers, typically silicon wafers. Each wafer is processed by subjecting the wafer to a series of processes including material deposition and etching procedures to create several integrated circuit dies on the wafer. The wafer is then partitioned and separated along streets to create individual die, typically through a sawing process. These dies are then bonded to leads, and finally packaged in a ceramic or plastic housing to form the final integrated circuit.

In the case of manufacturing micromechanical devices, as well as other devices such as biological or chemical sensors, it is desired to further process the semiconductor wafer after a "partial-saw" process. That is, before the wafer is completely diced or cut to form each of the individual die. The partial-saw process is beneficial to initially and accurately cut the wafer along the streets while the wafer is easily registerable with processing equipment, and before the circuit is complete. However, this partial-saw process undesirably generates particles which can contaminate, damage, and possibly render useless, the individual dies if not carefully controlled. Micromechanical devices generally include miniature devices manufactured upon a substrate and have moving parts. Some examples include microaccelerometers, micromotors and gears. These micromechanical devices are particularly vulnerable to particles, and thus the partial-saw process is useful to achieve a partial cut before the moving parts are defined. Clean-up to remove residual debris and particles after the partial-saw process is critical.

A recent innovation of Texas Instruments Incorporated of Dallas Tex., is the digital micromirror device or the deformable mirror device (collectively DMD). The DMD is an electro/mechanical/optical Spatial light modulator (SLM) suitable for use in displays, projectors and hard copy printers. The DMD is a monolithic single-chip integrated circuit SLM, comprised of a high density array of 16 micron square movable micromirrors on 17 micron centers. These mirrors are fabricated and supported over address circuitry including an array of SRAM cells and address electrodes. Each mirror forms one pixel of the DMD array and is bistable, that is to say, stable in one of two positions, wherein a source of light directed upon the mirror array will be reflected in one of two directions. In one stable "on" mirror position, incident light to that mirror will be reflected to a projector lens and focused on a display screen or a photosensitive element of a printer. In the other "off" mirror position, light directed on the mirror will be deflected to a light absorber. Each mirror of the array is individually controlled to either direct incident light into the projector lens, or to the light absorber. The projector lens ultimately focuses and magnifies the modulated light from the pixel mirror array onto a display screen and produce an image in the case of a display. If each pixel mirror of the DMD array is in the "on" position, the displayed image will be an array of bright pixels.

For a more detailed discussion of the DMD device and uses, cross reference is made to U.S. Pat. No. 5,061,049 to Hornbeck, entitled "Spatial Light Modulator and Method"; U.S. Pat. No. 5,079,544 to DeMond, et al, entitled "Standard Independent Digitized Video System"; and U.S. Pat. No. 5,105,369 to Nelson, entitled "Printing System Exposure Module Alignment Method and Apparatus of Manufacture", each patent being assigned to the same assignee of the present invention and the teachings of each are incorporated herein by reference. Gray scale of the pixels forming the image is achieved by pulse-width modulation techniques of the mirrors, such as that described in U.S. Pat. No. 5,278,652, entitled "DMD Architecture and Timing for Use in a Pulse-Width Modulated Display System", assigned to the same assignee of the present invention, and the teachings of which are incorporated herein by reference.

The individual mirrors of the DMD mirror array are easily susceptible to damage from debris including particles generated during the wafer saw and/or break process. Because the DMD is a micromechanical device with movable pixel mirrors, the DMDs fabricated upon a wafer may not be conveniently covered with a protective oxide coating prior to a final saw process as is conventional with other semiconductor processing techniques. Moreover, due to the conductive address electrodes with are positioned below the conductive mirrors, a conductive particle entrapped between the mirror and address electrode could easily short the mirror to the address electrode. Thus, it is particularly important in the case of the DMD to avoid leaving behind any particles during the wafer saw process and clean process.

As disclosed in commonly assigned U.S. Pat. No. 5,435,876 entitled Grid Array Masking Tape Process, one technique to protect the wafer during sawing is to utilize a grid array masking tape over the active surface of the processed wafer. The tape adheres to the wafer along a grid extending between the formed integrated circuits and prevents debris from damaging the active surface during the sawing process. The tape is removed after the saw process and then the photoresist under the mirror layer is undercut by a plasma etch process to form wells under the mirrors, allowing the mirrors to deflect.

Other techniques for processing a wafer to form micromechanical devices are disclosed in commonly assigned U.S. Pat. No. 5,393,706 entitled "Integrated Partial Sawing Process", U.S. Pat. No. 5,445,559, entitled "Wafer-Like Processing after Sawing DMDs", U.S. Pat. No. 5,435,876 entitled "Grid Array Masking Tape Process", and U.S. Pat. No. 5,389,182, entitled "Use of a Saw Frame with Tape as a Substrate Carrier for Wafer Level Backend Processing". The teaching of each of these commonly assigned patents is incorporated herein by reference.

In commonly assigned U.S. patent application Ser. No. 08/369,838 entitled "Separation of Wafer into Die with Wafer-Level Processing", there is disclosed a method of covering the surface of a wafer with a protective coating, whereby separation lines are then inscribed on the top surface of the wafer. These separation lines represent boundaries between die and have a predetermined depth. After the protective coating is removed, the wafer is further processed with at least one more wafer-level process. Finally, the wafer is separated into die along the separation lines. In this patent application, there is taught a method whereby the protective coating may be accomplished by first spinning-on a layer of photoresist and then depositing a thin oxide layer. This protective layer is later removed during the cleaning step using solvents, solvent streams, or ashing. In addition, a dry etch process can be used to remove a resist material.

One technical challenge encountered during the processing of the DMD is the fact that the micromechanical mirrors and associated support structure are fabricated upon CMOS addressing circuitry. Thus, when the wafer is partially sawn along the streets to form kerfs, oxide particles from the CMOS oxide layers of the wafer are generated, and may become disposed within the kerfs. These oxide particles can also be scattered about and disposed upon the protective layer, as shown in FIG. 1.

Although there are several techniques available for removing this debris including oxide particles, it has now recently been discovered that even after a cleanup process to remove oxide particles from the wafer surface and kerfs, the edges of the buried CMOS oxide layers adjacent the kerfs will continue to generate oxide particles over time, after a clean-up process. It has now been discovered that the subsequent generation of these oxide particles from the CMOS oxide layer is due to the microscopic damage, including intersecting cracks, in the walls of the CMOS oxide layers adjacent these kerfs. Time, vibration and other factors facilitate the continuous release of these microscopic oxide particles from the CMOS oxide layers adjacent the kerfs.

In commonly assigned patent application Ser. No 60/015, 107 entitled "Method of Cleaning Wafer After Partial Saw", there is disclosed an improved method of cleaning a partially processed wafer utilizing a solution consisting of an alkyl glycol, dilute hydrofluoric acid (HF) and deionized water to reduce the subsequent generation of particles after the clean-up process. The device is provided with compatible layers of photoresist to prevent defects in the photoresist layers. This method of utilizing an alkyl glycol is effective and allows a dilute concentration HF solution to be utilized without damaging an underlying micromechanical structure.

It is an object of the present invention to provide a further improved method of cleaning a semiconductor wafer after a partial-saw process, and before subsequent processing, which further reduces or eliminates the subsequent generation of debris, including oxide particles from underlying CMOS oxide layers, after the post-saw cleanup process. Such a method of reducing the subsequent generation of oxide particles should realize a substantially higher yield of dies, especially those of the micromechanical type including DMD's, but also other integrated circuits and devices that require subsequent processing including chemical or biological sensors.

SUMMARY OF THE INVENTION

The present invention achieves technical advantages as a method of fabricating a monolithic device, preferably a micromechanical device, by coating the device with a superhard, low-friction, protective layer having a hardness greater than 7 MOH, allowing a strong solution of Hydrofluoric Acid (HF) to be used during clean up after a partial-saw process. The superhard coating allows partial sawing to be done without chipping or delamination of underlying photoresist layers, and reduces the number of saw particles that can penetrate or become embedded in any of the photoresist layers. The superhard protective layer provides improved resistance to acid penetration from the top to the active area of the device when a strong acid, such as 6% buffered hydrofluoric acid (BHF) is used to etch away the damage in the edge of the intermediate oxide layer. The device is then megasonically vibrated in deionized water to remove debris including oxide particles and then dried. Then, the superhard protective layer is removed using conventional techniques, depending on the particular material chosen for the superhard protective layer. The superhard protective layer provides a low-friction surface capable of wet removal of hard particles that are generated during the partial-saw process.

The present invention achieves additional advantages by depositing two layers of photoresist that are compatible with one another, to avoid defects or side effects such as microcracks, bubbling and swelling originating in one or the other photoresist layer at the interface between the layers, or within either layer. The use of compatible layers of photoresist in combination with the superhard protective layer of the present invention allows a strong HF solution to be used to clean and etch away debris and remove the damaged edge of an oxide layer proximate a saw kerf. Each photoresist layer is preferably UV cured to form a hard layer.

Other monolithic devices such as CCD devices, sensors, and accelerometers that are sensitive to particles can also be manufactured according to the preferred embodiment of the present invention.

Preferred materials for the superhard layer can comprise of diamond-like carbon (DLC), TiW or other hard metal layers that can be conveniently etched away after a partial-saw process.

BRIEF DESCRIPTION OF THE DRAWINGS

FIG. 2 is a pictorial illustration of the conventional partially fabricated micromechanical device of FIG. 1, illustrating the microscopic cracks formed in the middle layer caused by photoresist incompatibility;

DESCRIPTION OF THE PREFERRED EMBODIMENT

Figure 1:
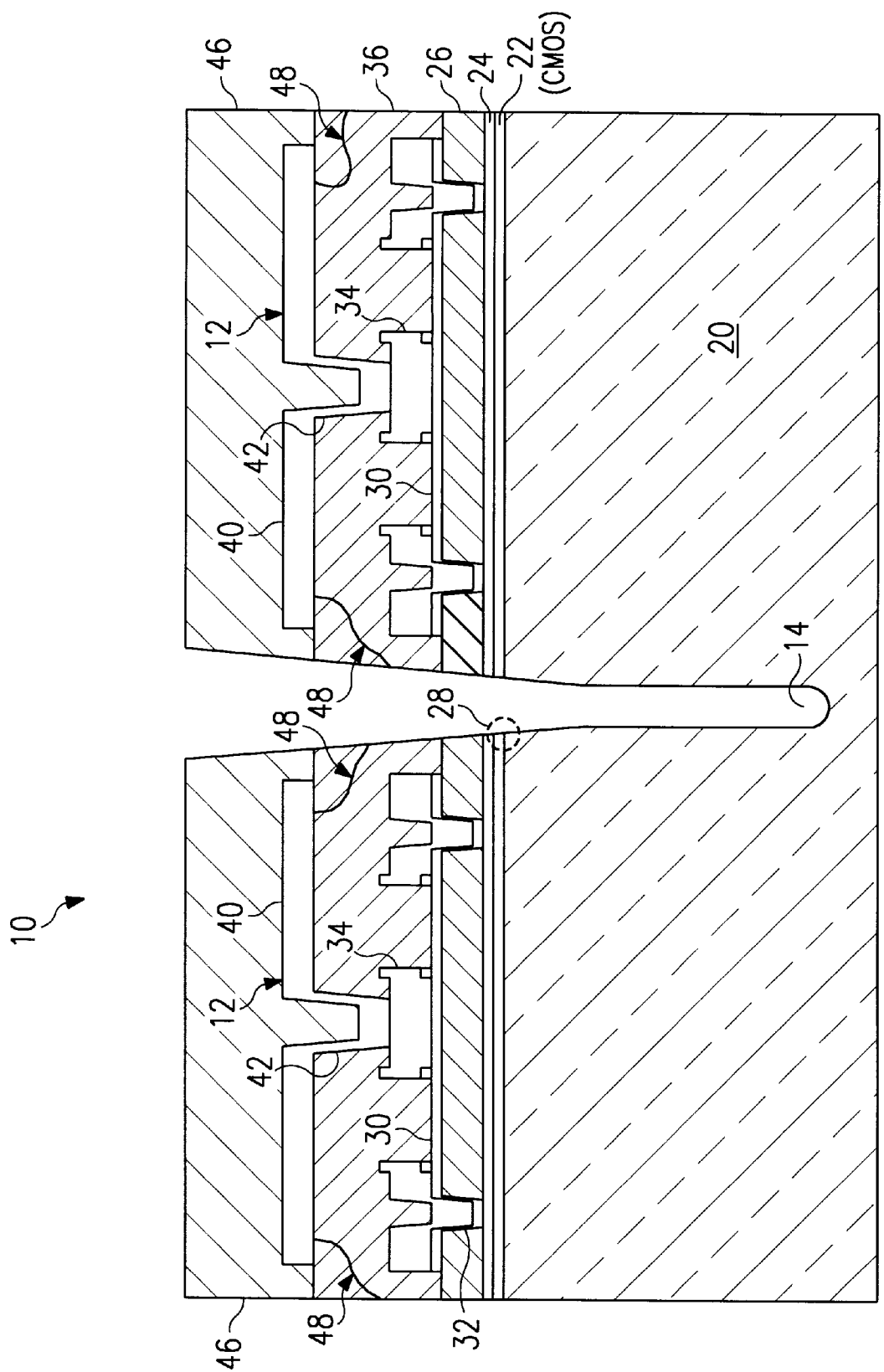
FIG. 1 is a side sectional view of a conventional partially fabricated micromechanical device whereby a top and middle spacer layer of photoresist are not compatible with one another, with microscopic cracks formed in the middle layer which allows a strong solution of hydrofluoric acid to permeate the upper protective photoresist layer and damage the buried micromechanical structure.

Referring now to FIG. 1, there is generally shown at 10 a cross section of a partially fabricated wafer having several partially fabricated micromechanical monolithic devices 12 separated from one another by a kerf 14. By way of example and for purposes of illustration of the present invention, the micromechanical devices 12 are shown as partially fabricated digital micromirrors devices (DMDs) such as those manufactured by Texas Instruments Incorporated of Dallas, Tex. The DMDs 12 shown are a subset of an area array of such micromirrors fabricated by sequentially depositing conductive materials over spacer layers, and then patterning the materials to form torsion hinges, support posts, yokes and pixel mirrors. These micromechanical structures are formed using conventional semiconductor processes, and are formed using a plurality of UV-cured photoresist layers.

For purposes of describing and understanding the present invention, there is shown a silicon wafer substrate 20, CMOS addressing circuitry 22 covered with a thin protective layer of oxide 24, and a first or lowermost spacer layer of UV-cured photoresist 26. A torsion hinge 30 supported by a pair of support posts 32 is shown fabricated over this lowermost spacer layer of photoresist 26. A middle spacer layer of photoresist 36 is shown deposited over this post, hinge and yoke structure. An elevated mirror 40 and associated mirror support post 42 are fabricated upon this middle spacer layer of photoresist 36. A top protective layer of photoresist shown at 46 is deposited over these partially fabricated micromechanical structures 12, and together with the middle layer of photoresist 36 encapsulates the pixel mirrors 40. For a detailed discussion of fabricating the micromechanical structure 12, cross reference is made to commonly assigned U.S. Pat. No. 5,535,047 entitled "Active Yoke Hidden Hinge Digital Micromirror Device", the teachings incorporated herein by reference.

Conventionally, the top or protective layer of photoresist 46 is cured at a lower temperature than the curing temperature of the photoresist layers 26 and 36. This is because if the previous cure temperature is exceeded, outgassing and thermal stress may be induced. The temperature profiles used during the photoresist curing steps are limited to avoid damage to the micromechanical structure 12 encapsulated therewithin. In conventional devices, when the top layer of photoresist 46 and the middle layer of photoresist 36 are formed of incompatible materials, side effects or defects are formed at the interface, or within these layers, typically in layer 36 generally shown at 48. These defects or side effects can include, but without limitation to, microscopic cracking, bubbling or swelling. The formation of these microscopic cracks 48 in the photoresist layer 36 is illustrated in FIG. 2. After a partial-saw process to separate the partially fabricated micromechanical structures from one another, prior to subsequent processing, a hydrofluoric acid (HF) solution used to cleanse the wafer of debris permeates through this defective region 48 and damages the encompassed micromechanical structure, such as mirror 40. Moreover, a region 28 of the CMOS layer 22 proximate the kerf can continuously dislodge oxide particles proximate the kerfs, even after a wet acid etch clean-up, if only a weak HF solution is used.

As will now be described according to the preferred embodiment of the present invention, a superhard, low friction protective layer having a hardness of at least 7 MOH is provided, and these defects or side effects at region 48 are avoided, so that a very strong hydrofluoric acid solution can be utilized after the partial-saw process to substantially remove particles and debris residing on the wafer surface and in the saw kerf. The strong HF solution also removes the exposed damaged CMOS oxide surface at 28 proximate the kerfs to avoid subsequent generation of oxide particles.

Figure 3:
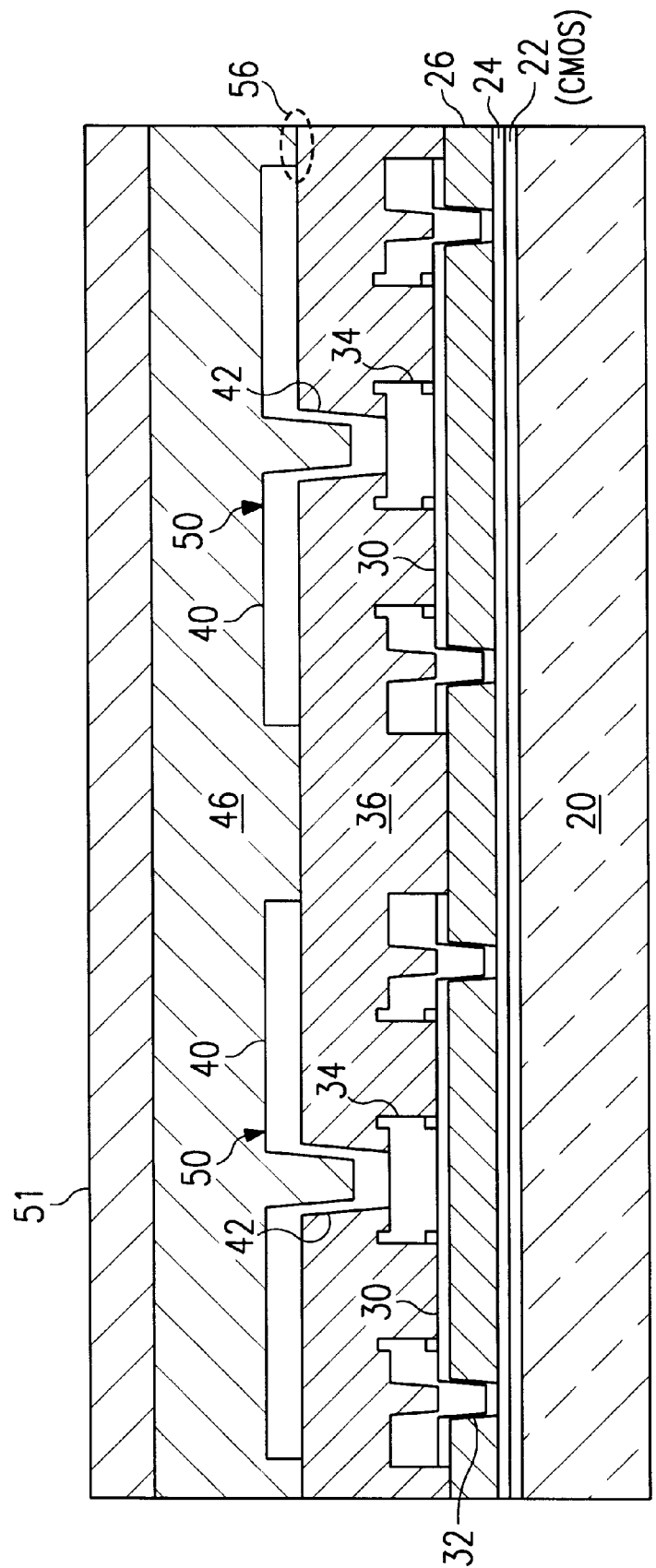
FIG. 3 is a cross section of partially fabricated micromechanical devices processed with a superhard, low friction, protective layer according to the present invention, whereby each layer of photoresist is compatible with its subsequent layer such that the photoresist layers are free of defects or side effects, allowing a strong solution of hydrofluoric acid to be utilized during the post-saw wafer clean up process.

Referring now to FIG. 3, there is shown at 50 partially fabricated micromechanical devices according to the preferred embodiment of the present invention. Device 50 is fabricated much the same way as device 12 is fabricated as discussed in reference to FIG. 1. According to the preferred embodiment of the present invention, the partially fabricated micromechanical device 50 is further processed by depositing a thin superhard protective layer 51 that has a low coefficient of friction to facilitate removal of particles generated during the sawing process. The layer 51 is preferably in the range of 200–4000 Angstroms thick depending on the type of layer. The superhard protective layer 51 allows partial sawing to be done which process reduces chipping of the photoresist layers thereunder, and reduces the number of particles that can penetrate or become embedded in the underlying photoresist layers. By depositing the superhard protective layer 51, the layer 51 provides improved resistance to acid penetration from the top to the active area of the devices 50, thus permitting a stronger acid to be used to etch away the damage at 28 in the edges of the cut underlying oxide layer 24.

Figure 4:
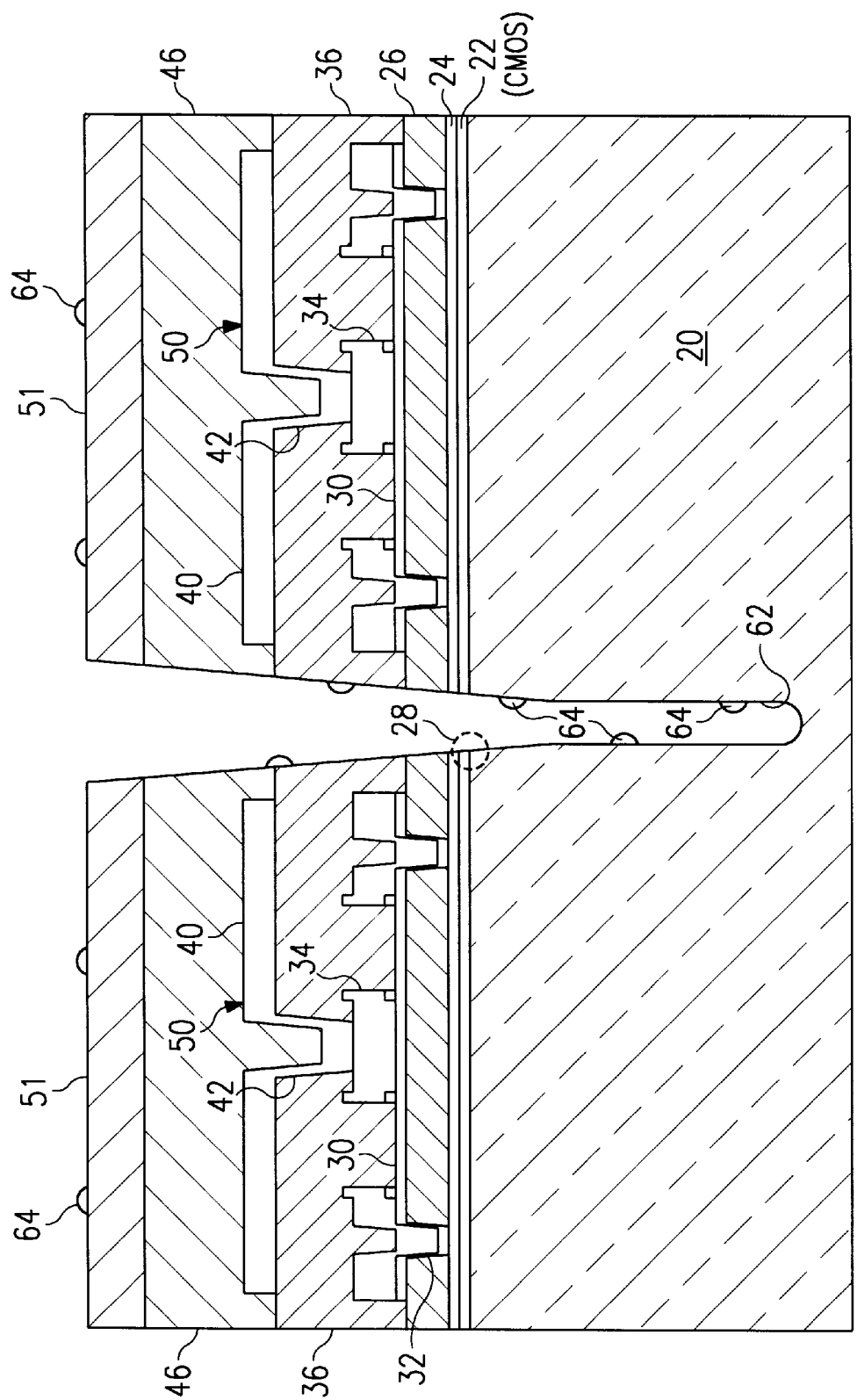
FIG. 4 is a cross section of the partially fabricated wafer of FIG. 3 including the pair of partially fabricated micromechanical devices separated by a kerf formed along the streets during a partial-saw process, whereby particles and debris are seen to reside within the kerf and on the surface of the superhard protective layer.

Referring to FIG. 4, there is shown the partially fabricated wafer including a pair of the partially fabricated micromechanical devices 50 separated from one another by a saw kerf 62 formed along the streets separating these micromechanical devices. During the partial-saw process, debris shown at 64 is formed and becomes positioned at the wafer surface and in the saw kerf 62. Some of the particles are oxide particles formed by sawing the CMOS oxide layer 22 and oxide layer 24.

Figure 5:
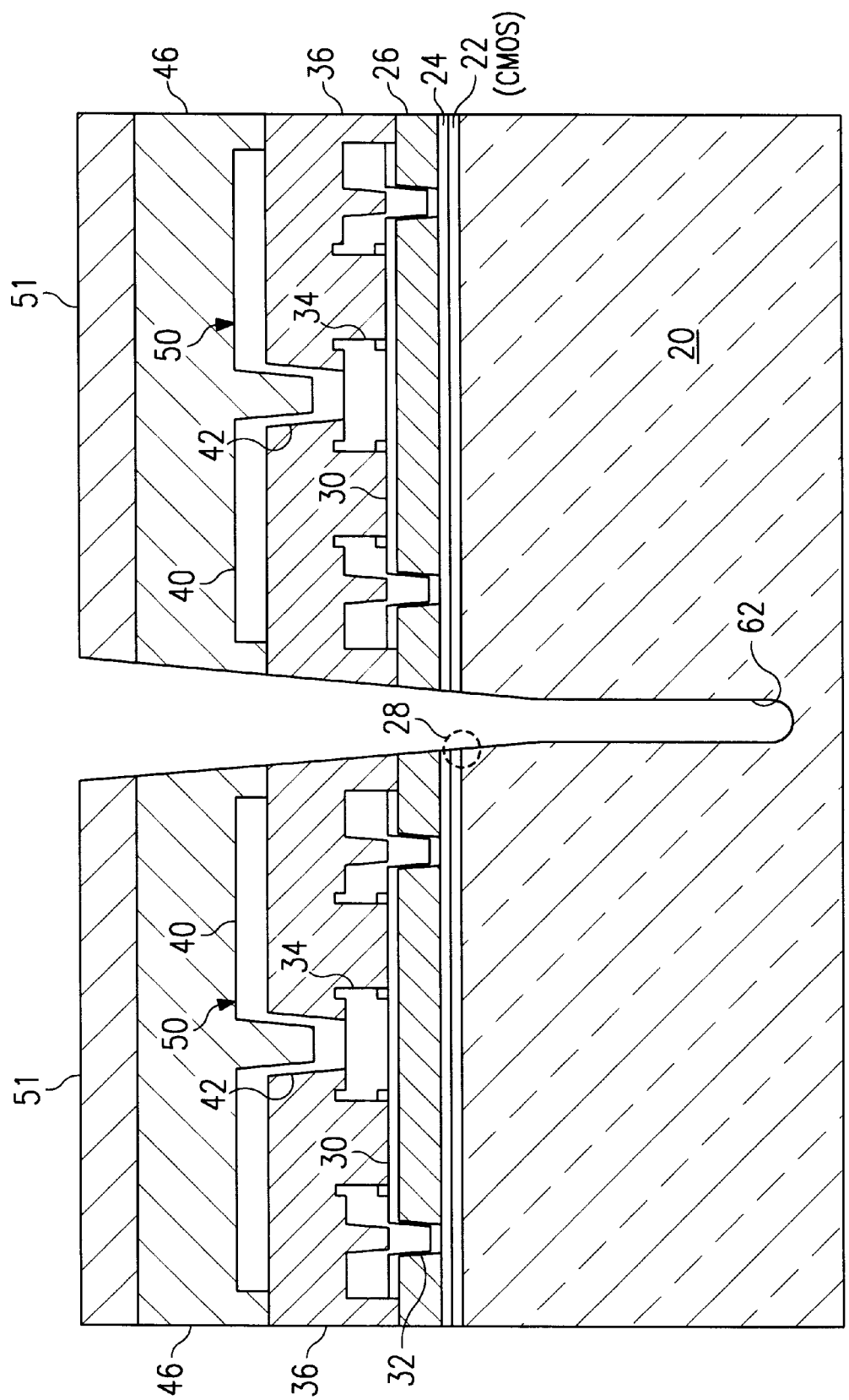
FIG. 5 is the partially fabricated wafer shown in FIG. 4 after a clean-up process utilizing a very strong solution of hydrofluoric acid whereby the partially fabricated micromechanical devices are protected by the superhard protective layer and have compatible spacer layers of photoresist material according to the preferred embodiment of the present invention.

Referring now to FIG. 5, by providing the superhard protective coating 51 upon the uppermost third photoresist layer 46, there will be less chipping of the photoresist layers 26, 36 and 46, and thus there will be fewer particles penetrating or becoming embedded in the photoresist layers. In addition, the combination of the protective layer 51 and the reduced damage to the photoresist layers allows a very strong acid to be used to etch away the damage in the edge of the oxide layer 24, shown at 28. Preferably, a strong acid such as 6% buffered hydrofluoric acid (BHF) is used. As shown in FIG. 5, the debris including oxide particles shown at 64 can be removed from the wafer surface and from the kerf 62. The strong concentration of buffered hydrofluoric acid is preferably used in combination with deionized water. The present invention achieves technical advantages since, this debris is thoroughly removed with the strong solution of the BHF without damaging the partially fabricated micromechanical devices 50. The strong solution of BHF will not permeate through any damaged areas, and the underlying micromechanical structure 50 remains unaffected during the cleansing process.

According to the present invention, the use of the 6% BHF solution also derives benefits by removing about 1–2 microns of the exposed damaged CMOS/oxide stack shown at 28. Again, the damage of the CMOS oxide layer at 28 is caused by the saw process. By removing the damaged portion of the CMOS oxide layer proximate kerf 62, oxide particles will not be continuously dislodged after the wet-acid etch clean-up process. This, in turn, increases the yield of the micromechanical devices. Therefore, the ability to use the strong solution of HF derives several important benefits.

In the preferred embodiment of the present invention, the protective layer 51 is chosen from a group of selected hard materials that have a hardness of greater than 7 MOH. In addition, these materials are suited for conformal deposition, and have a low friction/low adhesion to particles i.e. n<0.05. The material is compatible with photoresist removal processes, and leaves behind no residue when removed. The chosen material is also one that will not clog-up the saw blade, such as is the case for aluminum material.

In the preferred embodiment of the present invention, the material is preferably diamond-like carbon (DLC) or TiW. The DLC layer can be etched away after the wafer is rinsed and dried by using an oxygen plasma. Thereafter, the photoresist layers are etched away with an oxygen-fluorine plasma. If a TiW material is used as the protective layer 51, this protective layer is later etched away with a 30% hydrogen peroxide, with the photoresist layers then being removed using the oxygen-fluorine plasma.

While DLC and TiW are the preferred materials, again, many such materials are suitable if they meet the previously mentioned characteristics. These materials will typically be comprised of metal, but not necessarily. An expanded list of suitable materials for protective layer 51 can include W, SiC, Ni, $Si_3N_4$, $A_2O_3$, $MgAl_2O_4$, $N_1$, Pt, and Ta.

This list is not intended to be exhaustive, but rather illustrative of many materials that meet the necessary parameters of being hard, conformal, low friction materials that are suitable with conventional semiconductor processing, and can be easily stripped away without leaving behind residue.

As disclosed in commonly assigned U.S. patent Ser. No. 60/016,732, entitled "Method of Reducing Wafer Particles After Partial Saw", the materials of the lower photoresist layer 26, the middle photoresist layer 36, and the uppermost photoresist layer 46 are all chosen to be compatible with one another. That is, the layers of photoresist are selected such that the deposition of the photoresist layers do not induce defects or side effects in the layers of the photoresist layers, or at the interfaces thereof. The teachings of co-pending patent application Ser. No. 60/016,732, are incorporated herein by reference for a selection and application of compatible photoresist layers.

In the preferred embodiment of the present invention, the middle spacer layer of photoresist 36 is identified as part number PF126B8, made by Sumitomo Chemical America, and the top layer or protective layer of photoresist 46 is identified as Shipley resist #1813. Preferably, the lowermost layer 26 is identified as PFRIX710-D75, made by JSR MicroElectronics.

In an alternative preferred embodiment of the present invention, the middle layer of photoresist 36 is identified as PFRIX300-D75, manufactured by JSR MicroElectronics, and the top layer of photoresist 46 is comprised of PFRIX710-D75 manufactured by JSR MicroElectronics. Preferably, the top layer of photoresist layer 46 is comprised of the same material as the lower most layer of photoresist layer 26 because of process simplification, i.e. using 2 types of photoresist instead of 3.

The thickness of the photorpsist layers are preferably as follows. The lowermost layer of photoresist 26 preferably has a thickness of about 1 micron. The middle layer of photoresist 36 preferably has a thickness of about 2 microns, and the top layer of photoresist 46 preferably has a thickness of between 1 and 2 microns. The thickness of these layers depend on viscosity, processing parameters, and cure requirements.

By implementing the superhard protective layer 51, in combination with compatible photoresist layers 26, 36 and 46, a sufficiently strong acid can be used to etch away particles, and remove damage in the oxide layer edges at 28. The present invention substantially increases wafer yield by reducing particle penetration of and adherence to the photoresist layers during saw processing and thereby reducing damage to the active area of the devices during acid etching, and preventing ultimate device failure caused by particles generated after processing that could become dislodged from intersecting microcracks.

Figure 6:
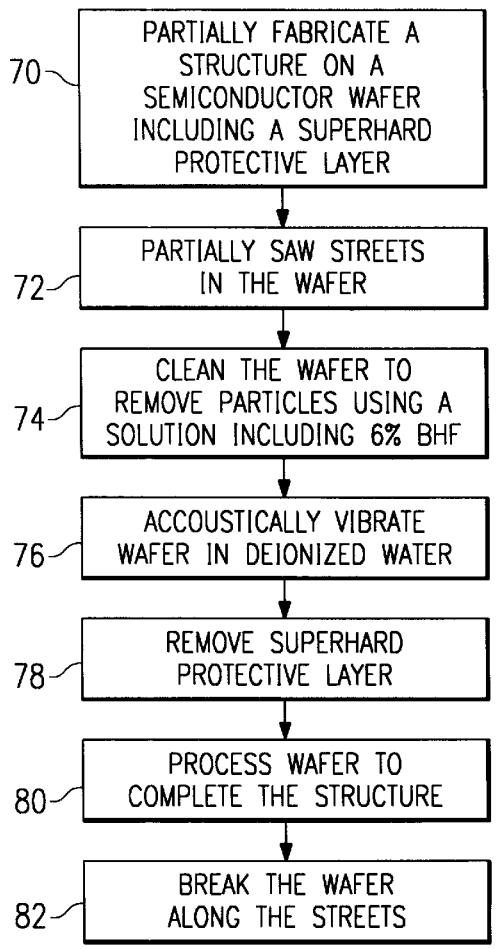
FIG. 6 is a flow diagram of the method according to the preferred embodiment of the present invention to fabricate and clean the partially fabricated wafer.

Turning now to FIG. 6, there is shown a method of fabricating a monolithic micromechanical structure from a wafer according to the preferred embodiment of the present invention. At step 70, a micromechanical structure is partially fabricated on a semiconductor wafer 20, as shown in FIG. 3, and includes the protective layer 51 comprises of the superhard material previously described. The thickness of layer 51 is preferably in the range of 200–4000 Angstroms depending on type of material deposited. This micromechanical structure may be fabricated using techniques such as those described in commonly assigned U.S. Pat. No. 5,535,047 entitled "Active Yoke Hidden Hinge Digital Micromirror Device", the teaching of which are incorporated herein by reference. According to the preferred embodiment of the present invention, the lower photoresist layer 26, the middle photoresist layer 36, and the top photoresist layer 46 are all chosen as previously described in the cross referenced commonly assigned patent to avoid any damage or side effects to these layers of photoresist and at the interface of these three layers.

At step 72, the wafer is sawn along the streets between the micromechanical devices 50 to form the kerfs 62, shown in FIG. 4 and in FIG. 5.

At step 74, the wafer is cleaned with a strong solution of buffered hydrofluoric acid (BHF) and deionized water for 1–2 minutes. Preferably, 6% buffered hydrofluoric acid (BHF) is utilized. By rinsing the partially fabricated wafer, debris including oxide particles 64 is removed, as shown in FIG. 5. In addition, 1–2 microns of the damaged CMOS stack shown at 28 proximate the kerfs 62 is removed.

At step 76, the cleansed wafer is vibrated in deionized water. Preferably, this is done by megasonic process.

At step 78, the superhard protective layer 51 is etched away. The particular process used to etch away the protective layer 51 depends on the selected material. For instance, if DLC is used, an oxygen plasma is used to etch away the layer. If a layer of TiW is used, a 30% hydrogen peroxide etchant is used. The particular process utilized for removing the protective layer is suited to remove the particular material of the protective layer, and is also chosen to be compatible with removing photoresist and leaves behind no residue.

At step 80, the wafer is further processed to complete the structure, which includes removing all photoresist spacer layers including layer 26, 36 and 46 shown in FIG. 3. Preferably, these photoresist layers are removed using a dry plasma ash process. This ash process preferably utilizes two or three gases at different rates, and at RF settings that gently remove the photoresist layers. Preferably, an $O_2$ gas in combination with a small amount of $NF_3$ gas is utilized, and possibly a portion of Argon gas.

At step 82, the wafer is broken along the kerfs 62 to form completed individual micromechanical structures which are later hermetically sealed to form a completed DMD device.

In summary, the present invention comprises a method of fabricating a monolithic device, particularly a micromechanical device, from a wafer with reduced particles. By utilizing a superhard, low friction protective layer, and by carefully selecting the composition of the various spacer photoresist layers, damage to the underlying micromechanical structure is avoided during a wet chemical etch clean-up process. According to the present invention, a very strong solution of buffered hydrofluoric acid can be utilized to thoroughly cleanse the wafer after a partial-saw process to remove particles including oxide particles, and remove the damaged edges of the CMOS oxide layers proximate the kerfs. The chosen layers of photoresist are compatible to avoid bubbling, cracking, swelling, etc. of the layers, particularly the second or middle photoresist layer.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications. For instance, the present invention is well suited to fabricate other monolithic devices which are sensitive to particles including, but not limited to, CCD devices, sensors and accelerometers.

We claim:

1. A method of fabricating a monolithic device from a wafer, comprising the steps of:
    a) partially fabricating the device by depositing at least one layer of photoresist on the wafer with a structure disposed therewith;
    b) depositing a layer of protective material over said device, said layer of protective material having a hardness of at least 7 MOH;
    c) sawing the wafer to form kerfs;
    d) cleansing the device with a solution of hydrofluoric acid (HF) having a concentration of at least 1%; and
    e) removing said layer of protective material.

2. The method as specified in claim 1 comprising a first and a second said photoresist layers that are compatible with each other such that the HF solution does not permeate either said first or second photoresist layer and damage the structure.

3. The method as specified in claim 2, wherein the device is a micromechanical device, and the structure defined between the first and the second photoresist layer is a micromechanical structure.

4. The method as specified in claim 1, wherein said layer of protective material is selected from the group consisting of TiW, W, DLC, SiC, $Si_3N_4$, $Al_2O_3$, $MgAl_2O_4$, Pt, Ta, and Ni.

5. The method as specified in claim 2, wherein the second layer of photoresist is deposited such that the first and second layers of photoresist are free of microscopic cracks.

6. The method as specified in claim 2 wherein the first and the second photoresist layers are comprised of two different types of photoresist.

7. The method as specified in claim 2 wherein the first and the second layers of photoresist are cured and comprise a bottom and a top layer, respectively, whereby the top layer is cured at a lower temperature than a cured temperature of the bottom layer of photoresist.

8. The method as specified in claim 1 further comprising the step of removing said photoresist layer with a plasma ash process.

9. The method as specified in claim 1 wherein the wafer includes at least one layer of CMOS oxide, wherein the device is cleansed with the HF solution to remove a portion of the CMOS oxide layer proximate the kerf.

10. The method as specified in claim 9 wherein at least 1 micron of the CMOS oxide layer is removed proximate the kerf.

11. The method as specified in claim 9, wherein the entire damaged portion of the CMOS oxide layer generated by the partial-saw process proximate the kerf is removed by the HF solution.

12. The method as specified in claim 11 wherein said solution comprises about 6% HF acid.

13. The method as specified in claim 1, further comprising the step of megasonically vibrating the wafer in deionized water, rinsing and drying the wafer, and then separating the wafer along the kerfs.

14. The method as specified in claim 1, wherein the device is partially fabricated in the step a) with a bottom, a middle and a top layer of photoresist, wherein each said photoresist layer is compatible with the subsequent layer so as not to produce cracks in the layers.

15. The method as specified in claim 1, further comprising the step of megasonically vibrating the wafer in deionized water with a surfactants, rinsing and drying the wafer, and then separating the wafer along the kerfs.

* * * * *